United States Patent
Kim et al.

(10) Patent No.: US 12,224,402 B2
(45) Date of Patent: *Feb. 11, 2025

(54) ELECTROCHEMICAL ELEMENT FOR INDUCING INTERNAL SHORT CIRCUIT, AND METHOD FOR EVALUATING SAFETY USING SAME

(71) Applicant: LG ENERGY SOLUTION, LTD., Seoul (KR)

(72) Inventors: Tae Jong Kim, Daejeon (KR); Seo Young Yoon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 780 days.

This patent is subject to a terminal disclaimer.

(21) Appl. No.: 17/433,788

(22) PCT Filed: Jul. 28, 2020

(86) PCT No.: PCT/KR2020/009920
§ 371 (c)(1),
(2) Date: Aug. 25, 2021

(87) PCT Pub. No.: WO2021/025358
PCT Pub. Date: Feb. 11, 2021

(65) Prior Publication Data
US 2022/0140401 A1   May 5, 2022

(30) Foreign Application Priority Data

Aug. 7, 2019   (KR) .................. 10-2019-0096020

(51) Int. Cl.
*H01M 10/0585* (2010.01)
*G01R 31/52* (2020.01)
(Continued)

(52) U.S. Cl.
CPC ........ *H01M 10/0585* (2013.01); *G01R 31/52* (2020.01); *H01M 10/4235* (2013.01); *H01M 50/463* (2021.01)

(58) Field of Classification Search
CPC ......... H01M 10/0585; H01M 10/4235; H01M 50/463; H01M 10/4285; H01M 10/42;
(Continued)

(56) References Cited

U.S. PATENT DOCUMENTS 5,051,157 A * 9/1991 O'Brien ................. B23H 3/00
429/10
5,523,730 A   6/1996 Van Zeeland
(Continued)

FOREIGN PATENT DOCUMENTS

CN   201112491 Y   9/2008
CN   204614848 U   9/2015
(Continued)

OTHER PUBLICATIONS

International Search Report (with partial translation) and Written Opinion dated Nov. 18, 2020 issued in corresponding International Patent Application No. PCT/KR2020/009920.
(Continued)

*Primary Examiner* — Michael L Dignan
(74) *Attorney, Agent, or Firm* — MORGAN, LEWIS & BOCKIUS LLP

(57) ABSTRACT

The present technology relates to: an electrochemical element which comprises a separator having through-holes formed therein, a through-hole cover material, and a spacer; and a method for using the electrochemical element to evaluate the safety of an energy storage device by means of an internal short circuit. An energy storage device including the electrochemical element according to the present invention is characterized in that: the energy storage device can be
(Continued)

restored, after an internal short circuit evaluation test, to a state in which a short circuit has not occurred; and a repeat test and evaluation can be carried out without disassembly and reassembly.

11 Claims, 4 Drawing Sheets

(51) Int. Cl.
*H01M 10/42* (2006.01)
*H01M 50/463* (2021.01)

(58) Field of Classification Search
CPC .. H01M 50/46; H01M 50/474; H01M 50/477; H01M 50/48; H01M 50/486; H01M 10/0525; H01M 10/058; G01R 31/52; H01G 11/84; H01G 11/16; H01G 11/52; H01G 11/14; Y02E 60/10; Y02P 70/50
See application file for complete search history.

(56) References Cited

U.S. PATENT DOCUMENTS

| | | | |
|---|---|---|---|
| 9,142,829 B2 | 9/2015 | Keyser et al. | |
| 11,990,588 B2* | 5/2024 | Yoon | H01M 10/0585 |
| 2012/0288736 A1* | 11/2012 | Kim | H01M 50/423 |
| | | | 427/78 |
| 2013/0209841 A1* | 8/2013 | Keyser | H01M 10/4285 |
| | | | 429/50 |
| 2018/0151884 A1* | 5/2018 | Yushin | H01M 4/134 |
| 2021/0366666 A1* | 11/2021 | Kirihara | H01M 10/637 |

FOREIGN PATENT DOCUMENTS

| | | | |
|---|---|---|---|
| CN | 107706525 | A | 2/2018 |
| CN | 207557446 | U | 6/2018 |
| CN | 207800818 | U | 8/2018 |
| CN | 208173742 | U | 11/2018 |
| CN | 109346661 | A | 2/2019 |
| EP | 3826097 | A1 | 5/2021 |
| JP | 2008-192496 | A | 8/2008 |
| JP | 2009-054300 | A | 3/2009 |
| JP | 2016-004627 | A | 1/2016 |
| JP | 2017-182976 | A | 10/2017 |
| JP | 2021-535568 | A | 12/2021 |
| KR | 10-2008-0069760 | A | 7/2008 |
| KR | 10-2009-0130412 | A | 12/2009 |
| KR | 10-2012-0126630 | A | 11/2012 |
| KR | 10-2014-0066364 | A | 6/2014 |
| KR | 10-2014-0140092 | A | 12/2014 |
| KR | 10-2019-0049146 | A | 5/2019 |
| KR | 10-2019-0088033 | A | 7/2019 |

OTHER PUBLICATIONS

Extended European Search Report issued from the European Patent Office dated Mar. 23, 2022 in connection with the corresponding European Patent Application No. 20849878.2.

Office Action issued in corresponding Japanese Patent Application No. 2021-552178 dated Oct. 3, 2022.

Office Action issued Aug. 12, 2023 in corresponding Chinese Patent Application No. 202080030278.7.

Indian Examination Report issued from the Indian Patent Office dated May 30, 2023 in connection with the corresponding Indian Patent Application No. 202117036664.

* cited by examiner

[FIG. 1]
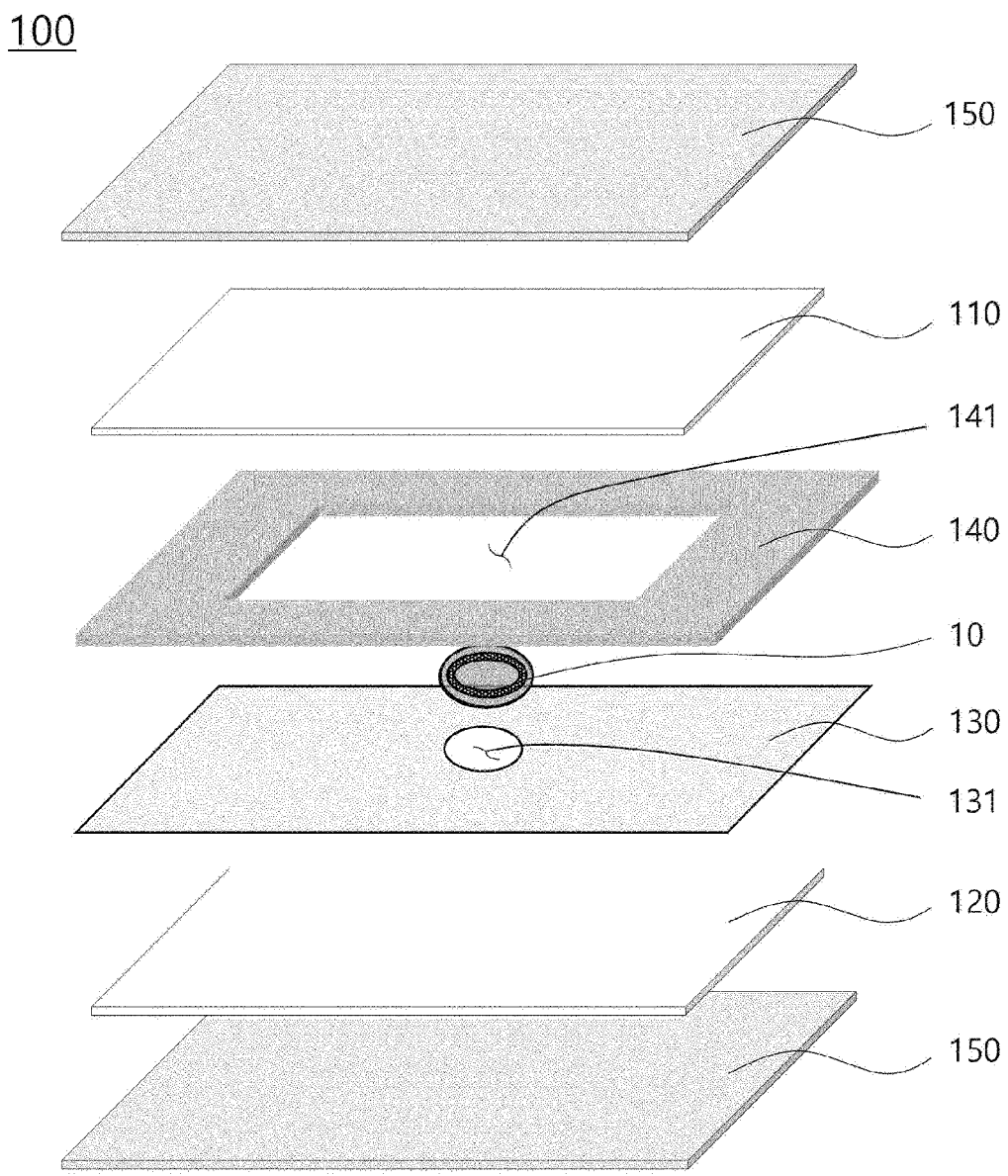

[FIG. 2]
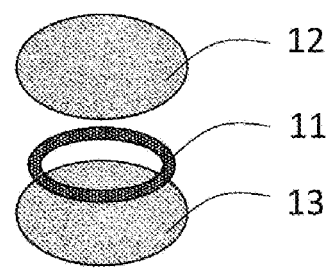

[FIG. 3]
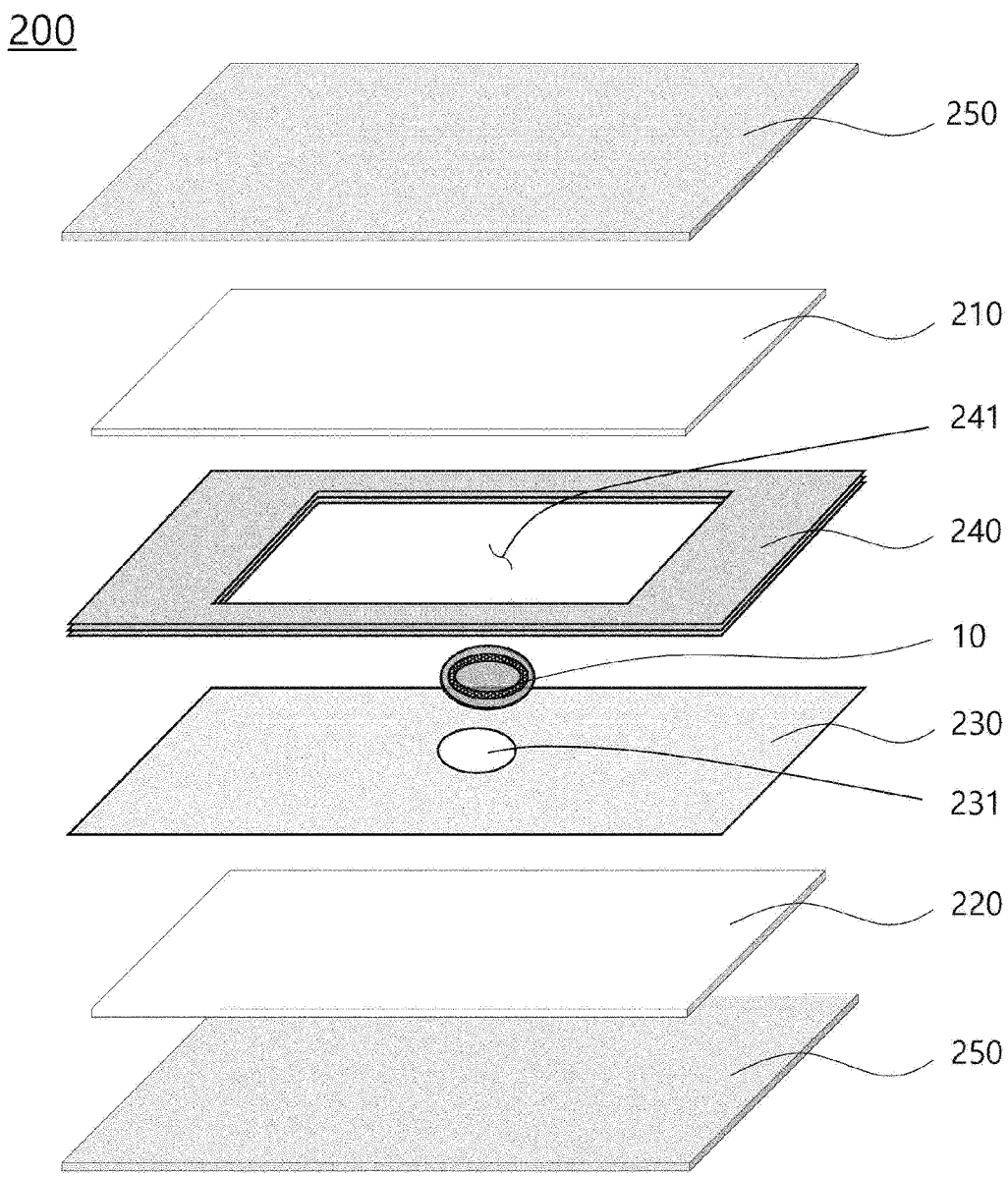

[FIG. 4]
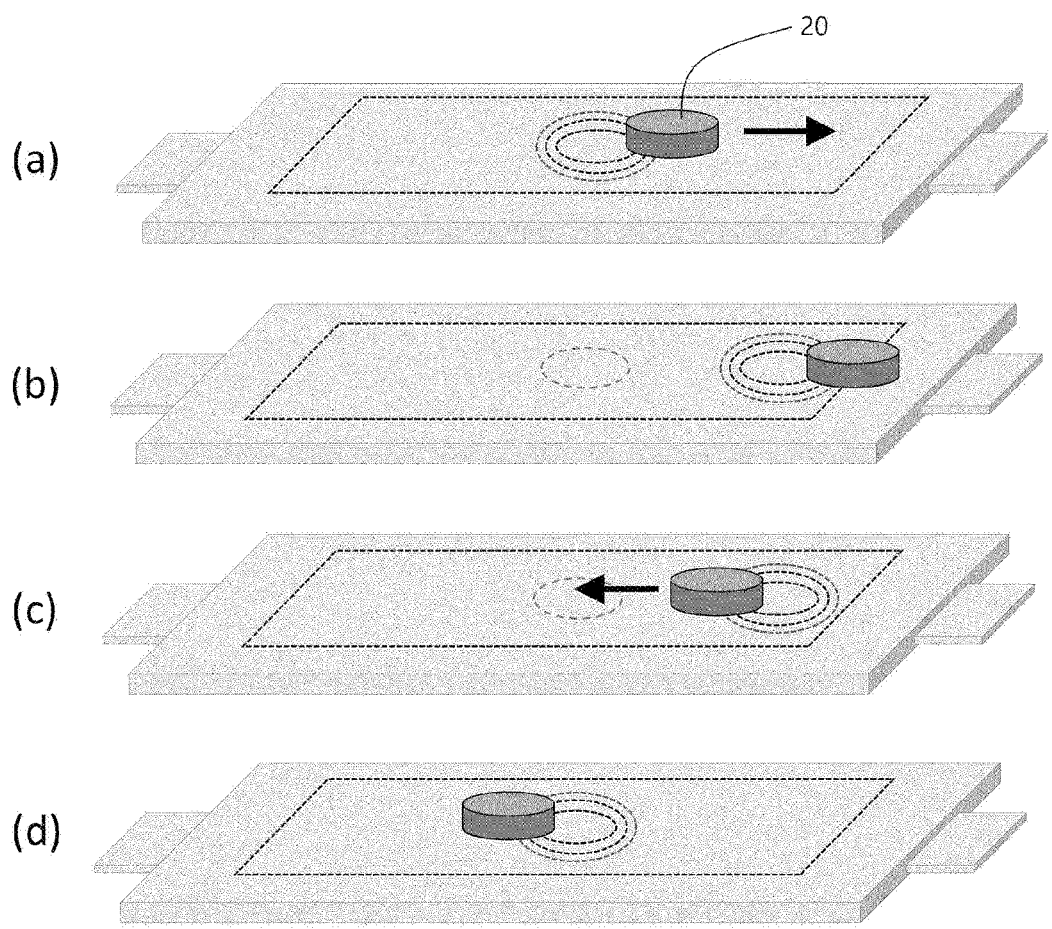

ELECTROCHEMICAL ELEMENT FOR INDUCING INTERNAL SHORT CIRCUIT, AND METHOD FOR EVALUATING SAFETY USING SAME

TECHNICAL FIELD

The present invention relates to an electrochemical device including a separator having a through hole, a through-hole cover material, and a spacer, and a method for evaluating the safety of an energy storage device due to an internal short circuit using the electrochemical device.

This application claims the benefit of priority based on Korean Patent Application No. 10-2019-0096020, filed on Aug. 7, 2019, and the entire contents of the Korean patent application are incorporated herein by reference.

BACKGROUND ART

As the price of energy sources increases due to depletion of fossil fuels and the interest in environmental pollution increases, the demand for environmentally friendly alternative energy sources becomes an indispensable factor for future life. Especially, as technology development and demand for mobile devices are increasing, demand for secondary batteries as energy sources is rapidly increasing.

Typically, in terms of the shape of the battery, there is a high demand for a prismatic secondary battery and a pouch-type secondary battery that can be applied to products such as mobile phones with a small thickness. In terms of materials, there is a high demand for lithium secondary batteries such as lithium ion batteries and lithium ion polymer batteries having high energy density, discharge voltage, and output stability.

Generally, in order to prepare a secondary battery, first, a positive electrode and a negative electrode are formed by applying an electrode mixture containing an electrode active material to a surface of a current collector, then a separate is interposed therebetween to thereby make an electrode assembly, which is then mounted in a cylindrical or rectangular metal can or inside a pouch-type case of an aluminum laminate sheet, and a liquid electrolyte in injected or impregnated into the electrode assembly or a solid electrolyte to prepare a secondary battery.

Further, secondary batteries are classified according to the structure of the electrode assembly having a positive electrode/separator/negative electrode structure. Representative examples thereof include a jelly-roll (wound) electrode assembly in which long sheet type positive electrodes and negative electrodes are wound with a separator interposed therebetween, a stacked electrode assembly in which a plurality of positive and negative electrodes cut in a predetermined size unit are sequentially stacked with a separator interposed therebetween, and a stacked/foldable electrode assembly in which bi-cells or full cells, in which positive and negative electrodes of a predetermined unit are stacked with a separator interposed therebetween, are wound with a separator sheet.

On the other hand, the electrode generates a current through the exchange of ions, and the positive electrode and negative electrode constituting the electrode has a structure in which the electrode active material is applied to the electrode current collector made of metal.

In general, the negative electrode has a structure in which a carbon-based active material is coated on an electrode plate made of copper or aluminum, and the positive electrode has a structure in which an active material made of $LiCoO_2$, $LiMnO_2$, $LiNiO_2$, or the like is coated on an electrode plate made of aluminum, etc.

In order to manufacture a positive electrode or a negative electrode, an electrode mixture including an electrode active material is coated on an electrode current collector made of a long metal sheet in one direction.

The separator is positioned between the positive electrode and the negative electrode of the battery to perform insulation and maintain the electrolyte to provide a passage for ion conduction.

The secondary battery is a rechargeable battery that is manufactured using a material that can repeat a plurality of redox processes between a current and a material. When the reduction reaction is performed on the material by the current, the power is charged, and when the oxidation reaction is performed on the material, the power is discharged. Herein, as the charge-discharge is repeatedly performed, electricity is generated.

The lithium secondary battery has a problem of low safety while having excellent electrical properties. For example, lithium secondary batteries generate heat and gas due to decomposition reaction of active materials and electrolytes, which are battery components, under abnormal operating conditions such as overcharge, overdischarge, exposure to high temperatures, and the resulting high temperature and high pressure conditions further promote the decomposition reaction and sometimes cause a fire or explosion.

In addition, it is very important to secure the safety even when an internal short circuit occurs in the battery, and for this purpose, it is important to correctly evaluate the safety of the battery when the internal short circuit occurs. As a battery stability item for lithium secondary batteries, details about a battery evaluation test for evaluating heat generation behavior during internal short circuits are explained in UL Standard for Lithium Batteries (UL1642), Guidelines from the Battery Industry Association (SBA G1101-1997 Lithium Secondary Battery Safety Evaluation Criteria Guidelines), etc.

There have been a method of putting a heating element inside the battery cell to induce an internal short circuit and generating internal heat by the heating element, a method of pre-drilling an internal separator and treating the area with chemicals to thereby be dissolved at a certain temperature, and a method of inducing an internal short circuit by tearing the separator by inserting a certain type of metallic material and applying external force. However, in the first method, the actual product and shape would be different due to the heating element inside the cell and the external heating source. In case of the second method, it was necessary to deform the actually used separator and chemical treatment was performed on the part where the separator was damaged, so there was a problem that the characteristics may be different from the existing products, and the desired reaction may not occur due to side reactions caused by the chemical reaction inside the cell.

On the other hand, US Patent Publication No. 2013-0209841 (Patent Document 1) discloses an internal short circuit induction device of a battery, in which after a separator is perforated, a copper plate is inserted into a battery cell, then copper and aluminum plates are put on both sides of the separator, and a wax layer is then installed between the copper plate and the separator or between the aluminum plate and the separator. When the temperature rises above the melting point of the wax layer in the internal short circuit induction device, the wax layer is removed and the positive and negative electrodes are electrically connected by copper and aluminum plates, causing an internal short circuit. However, this method has a problem that the manufacturing process of the internal short circuit induction device is complicated and the cost is high, and the battery cell should be disassembled and reassembled for repeated use.

DISCLOSURE

Technical Problem

The present invention was created to solve the above problems, and an object of the present invention is to provide an electrochemical device for evaluating the safety of an energy storage device without physically modifying the battery cell structure, and a method for evaluating the safety of the energy storage device using the electrochemical device.

Technical Solution

An electrochemical device according to the present invention to achieve the above object comprises:
  a positive electrode, a separator and a negative electrode, which are sequentially stacked,
  wherein the separator has at least one through hole communicating between the positive electrode and the negative electrode,
  wherein at least one interface between the positive electrode and the separator or between the negative electrode and the separator includes a spacer placed at a position not overlapping with the through hole, and
  wherein the interface on which the spacer is placed includes a through-hole cover material containing a magnetic material.

The through-hole cover material may overlap with the through hole formed in the separator and completely cover the through hole, thereby physically blocking contact between the positive electrode and the negative electrode through the through hole. In addition, one or more spacers may be included in the interface between the positive electrode and the separator or between the negative electrode and the separator in a form that does not overlap with the through hole, and the spacers may serve to secure a space so that the through hole cover material can be moved inside the electrochemical device.

On the other hand, the through-hole cover material may not be limited to its shape as long as it can cover the through hole, but it may be preferable that it has a plate shape to maximize space efficiency while being able to move inside the spacer.

In addition, the through-hole cover material may include one or more magnetic materials selected from Fe, Ni, and Co. By including the magnetic material in the through-hole cover material, it may be possible to move the through-hole cover material according to a magnetic field applied at a position spaced apart from the electrochemical device.

At this time, the magnetic material may have a plate shape likewise when the through-hole cover material has a plate shape, and may be formed in a ring shape to minimize the effect on the ionic conductivity.

As described above, since the magnetic material may include a conductive metal, it may cause a short circuit by simultaneously contacting the positive electrode or the negative electrode. Accordingly, a part or all of the outer peripheral surface of the magnetic material may be surrounded by an insulating material. In this case, the insulating material may be a porous polymer film, and more specifically, may be the same material as the separator.

When the direction orthogonal to the direction in which the positive electrode, the negative electrode and the separator of the electrochemical device is stacked is referred to as a horizontal direction, the horizontal cross-sectional area of the through-hole cover material may be larger than the area of the through hole formed in the separator. That is, the through-hole cover material should be capable of completely covering the through hole at a position overlapping with the through hole.

In addition, a horizontal cross-sectional area inside the spacer may be larger than a horizontal cross-sectional area of the through-hole cover material. Accordingly, the through-hole cover material can be moved inside the spacer.

On the other hand, the through-hole cover material may be moved by a magnetic field applied from the outside of the electrochemical device. Accordingly, it may be possible to completely cover the through hole by overlapping with the through hole, and by exposing the through hole, it may also be possible to cause a short circuit by direct contact between the positive electrode and the negative electrode. This positional movement can be made reversibly.

That is, the method for evaluating an internal short circuit using an electrochemical device according to the present invention may be performed in the following steps.

First, manufacturing an electrochemical device including a positive electrode, a negative electrode, a separator having a through hole, a spacer disposed on at least one interface between the positive electrode and the separator or between the negative electrode and the separator, and a through-hole cover material covering the through hole, is performed.

Then, a magnetic field may be applied to the through-hole cover material at a position spaced apart from the electrochemical device. At this time, the through-hole cover material containing the magnetic material may be moved according to the intensity and direction of the applied magnetic field.

When the through-hole cover material is moved to expose the through-hole, the separator through-hole covered by the through-hole cover material is exposed. Through this, the positive electrode and the negative electrode can be in direct physical contact, and an internal short circuit can be induced.

Through the above process, it is possible to evaluate the safety according to the internal short circuit by observing the change in the energy storage device such as the secondary battery and the capacitor in which the internal short has occurred.

In addition, if the internal structure of the energy storage device is not deformed due to the internal short circuit, it is possible to move the through-hole cover material again to cover the through hole at a position overlapping with the through hole. Therefore, it is possible to repeatedly perform internal short-circuit evaluation only by moving the through-hole cover material without separate disassembly or reassembly.

Advantageous Effects

An electrochemical device for inducing an internal short circuit of the present invention improves a problem that the energy storage device is physically deformed after an internal short circuit evaluation test, which was the biggest problem of the conventional methods, and internal short circuits can be induced in a variety of conditions and environments without physical changes. In addition, if there is no deformation of the energy storage device after the internal short-circuit evaluation, the through-hole cover material inside the electrochemical device may be moved again so that it overlaps with the through hole of the separator, and it can be restored to a state in which no short circuit occurs. As such, retest and evaluation are possible without disassembly and reassembly.

BRIEF DESCRIPTION OF THE DRAWINGS

FIG. 1 schematically shows the structure of a battery cell including an electrochemical device according to an embodiment of the present invention.

FIG. 2 schematically shows the structure of a through-hole cover material according to an embodiment of the present invention.

FIG. 3 schematically shows a structure including an electrochemical device according to another embodiment of the present invention.

FIG. 4 schematically illustrates a process of moving the through-hole cover material to induce an internal short circuit in the electrochemical device of the present invention, and then moving the through-hole cover material again to cover the through hole.

DETAILED DESCRIPTION OF THE PREFERRED EMBODIMENTS

As the inventive concept allows for various changes and numerous embodiments, particular embodiments will be illustrated in the drawings and described in detail in the text. However, this is not intended to limit the present invention to the specific form disclosed, and it should be understood to include all changes, equivalents, and substitutes included in the spirit and scope of the present invention.

In describing the drawings, similar reference numerals are used for similar elements. In the accompanying drawings, the dimensions of the structures are shown in an enlarged scale for clarity of the invention. The terms used to describe various components are for understanding, and the components should not be limited by the terms. The terms are used only for the purpose of distinguishing one component from another. For example, without departing from the scope of the present invention, a first component may be referred to as a second component, and similarly, the second component may also be referred to as the first component. Singular expressions include plural expressions unless the context clearly indicates otherwise.

In this application, it should be understood that terms such as "include" or "have" are intended to indicate that there is a feature, number, step, operation, component, part, or a combination thereof described on the specification, and they do not exclude in advance the possibility of the presence or addition of one or more other features or numbers, steps, operations, components, parts or combinations thereof.

Also, when a portion such as a layer, a film, an area, a plate, etc. is referred to as being "on" another portion, this includes not only the case where the portion is "directly on" the another portion but also the case where further another portion is interposed therebetween. On the other hand, when a portion such as a layer, a film, an area, a plate, etc. is referred to as being "under" another portion, this includes not only the case where the portion is "directly under" the another portion but also the case where further another portion is interposed therebetween. In addition, to be disposed "on" in the present application may include the case disposed at the bottom as well as the top.

In the specification of the present invention, "covering" means that the exposed part of an object is placed on one side so that the object is not visible, and when an object is "covered", it means that the exterior of the object is no longer revealed on the covered side. For example, "the through hole is covered with the through-hole cover material" means that the through-hole cover material is overlapped on the through hole, and the through-hole part is no longer exposed on the one side covered with the through-hole cover material.

Hereinafter, the present invention will be described in detail.

The internal short circuit test is a test for evaluating the resistance to internal short circuit among the safety tests of the battery, and is a test simulated when a positive electrode and a negative electrode are shorted inside the battery. In the internal short circuit test, a fully charged evaluation battery is first prepared, an internal short circuit is generated, and the behavior of the battery is evaluated. In general, when an internal short circuit occurs, the battery is discharged and the voltage decreases, and the test is performed until the voltage decreases below a certain value to evaluate the presence or absence of rupture, and the voltage and temperature of the battery, etc.

As an example of an internal short-circuit induction device designed for battery safety evaluation, in the case of an internal short circuit induction device developed by the National Energy Research Institute (NREL), an insulator made of wax is placed between the positive and negative electrodes to physically separate the positive and negative electrodes. Thereafter, when the battery is charged and discharged and the internal temperature of the battery rises to the melting point of the wax, the wax is removed, and the positive electrode and the negative electrode come into direct contact, causing a short circuit inside the battery.

Specifically, the conventional internal short circuit induction device creates a hole by perforating a part of a separator 120, inserts a block made of a metal material such as copper into the hole, and interposes a wax layer on one side of the metal block. In addition, the positive electrode plate is attached to the part of the separator where the wax layer is not interposed, and the negative electrode plate is attached to the wax layer. When the wax layer is removed, the positive electrode, the metal block, and the negative electrode come into direct contact, thereby causing a short circuit.

In a lithium ion secondary battery, a redox reaction occurs as lithium ions move between negative and positive electrodes. However, in the case of the battery having the conventional short circuit induction member as described above, an unreacted region was formed because it was impossible to move lithium ions due to the aluminum plate and the copper plate in the portion where the short circuit induction member is installed. Due to the unreacted region, battery performance such as capacity was reduced compared to conventional batteries, and the accuracy of the safety evaluation was reduced because it was difficult to simulate the correct behavior of the battery when an internal short circuit occurred. In addition, in the case of the conventional internal short circuit induction device, the manufacturing cost is high, and the battery cell should be disassembled and reassembled to include the structure of the short circuit induction device in order to reuse it after inserting it into the battery cell for assembly and testing. However, during the reassembly process, the assembly alignment may be distorted or the battery cell structure may be deformed, and this may cause unexpected safety problems.

In addition to the above-described method, there is a test method for the internal short circuit of a battery cell using a shape memory alloy. However, this also has a limitation that the battery should be heated to a certain temperature or higher, and as the shape of the shape memory alloy inserted inside the battery cell is deformed, there is a risk that other components of the battery cell other than the separator may be distorted.

Other known methods include nail penetration test and crush test. However, they irreversibly permanently deform the battery cell itself, and there is a problem in that a new battery cell should be manufactured for every test.

In the present invention, the electrochemical device can be used without limitation in energy storage devices such as capacitors and secondary batteries including positive electrodes, negative electrodes, and separators, and is a further improvement of the prior art.

Specifically, the electrochemical device of the present invention can be used in an electrode assembly inside a battery cell of a lithium secondary battery, and there is no limitation in the shape of a battery such as a cylindrical battery, a pouch-type battery, a prismatic battery or a coin-type battery, but in an embodiment of the present invention, a pouch-type battery was used.

The electrode assembly has a structure in which a negative electrode and a positive electrode are alternately stacked with a separator interposed between the electrodes and impregnated with a lithium salt non-aqueous electrolyte. The electrode for the secondary battery may be manufactured by applying an electrode mixture containing an electrode active material on a current collector and then drying the electrode mixture. The electrode mixture may further include a binder, a conductive material, a filler, and the like, as necessary.

In the present invention, the positive electrode collector generally has a thickness of 3 to 500 micrometers. The positive electrode current collector is not particularly limited as long as it has high conductivity without causing a chemical change in the battery. Examples of the positive electrode current collector include stainless steel, aluminum, nickel, titanium, sintered carbon or aluminum or stainless steel of which the surface has been treated with carbon, nickel, titanium, silver, or the like. The current collector may have fine irregularities on the surface thereof to increase the adhesion of the positive electrode active material, and various forms such as a film, a sheet, a foil, a net, a porous body, a foam, and a nonwoven fabric are possible.

The sheet for the negative electrode collector generally has a thickness of 3 to 500 micrometers. The negative electrode current collector is not particularly limited as long as it has electrical conductivity without causing chemical changes in the battery, and examples thereof include copper, stainless steel, aluminum, nickel, titanium, sintered carbon, copper or stainless steel of which the surface has been treated with carbon, nickel, titanium, silver or the like, aluminum-cadmium alloy, or the like. In addition, like the positive electrode current collector, fine unevenness can be formed on the surface to enhance the bonding force of the negative electrode active material, and it can be used in various forms such as a film, a sheet, a foil, a net, a porous body, a foam, and a nonwoven fabric.

In the present invention, the positive electrode active material is a material capable of causing an electrochemical reaction and a lithium transition metal oxide, and contains two or more transition metals. Examples thereof include: layered compounds such as lithium cobalt oxide ($LiCoO_2$) and lithium nickel oxide ($LiNiO_2$) substituted with one or more transition metals; lithium manganese oxide substituted with one or more transition metals; lithium nickel oxide represented by the formula $LiNi_{1-y}M_yO_2$ (wherein M=Co, Mn, Al, Cu, Fe, Mg, B, Cr, Zn or Ga and contains at least one of the above elements, $0.01 \leq y \leq 0.7$); lithium nickel cobalt manganese composite oxide represented by the formula $Li_{1+z}Ni_bMn_cCo_{1-(b+c+d)}MdO_{(2-e)}A_e$ such as $Li_{1+z}Ni_{1/3}Co_{1/3}Mn_{1/3}O_2$, $Li_{1+z}Ni_{0.4}Mn_{0.4}Co_{0.2}O_2$ etc. (wherein $-0.5 \leq z \leq 0.5$, $0.1 \leq b \leq 0.8$, $0.1 \leq c \leq 0.8$, $0 \leq d \leq 0.2$, $0 \leq e \leq 0.2$, $b+c+d<1$, M=Al, Mg, Cr, Ti, Si or Y, and A=F, P or CO; olivine-based lithium metal phosphate represented by the formula $Li_{1+x}M+M'_yPO_{4-z}X_z$ (wherein M=transition metal, preferably Fe, Mn, Co or Ni, M'=Al, Mg or Ti, X=F, S or N, and $-0.5 \leq x \leq 0.5$, $0 \leq y \leq 0.5$, $0 \leq z \leq 0.1$).

Examples of the negative electrode active material include carbon such as non-graphitized carbon and graphite carbon; metal complex oxide such as $Li_xFe_2O_3 (0 \leq x \leq 1)$, $Li_xWO_2 (0 \leq x \leq 1)$, $Sn_xMe_{1-x}Me'_yO_z$ (Me: Mn, Fe, Pb, Ge; Me': Al, B, P, Si, groups 1, 2, and 3 of the periodic table, halogen; $0 \leq x \leq 1$; $1 \leq y \leq 3$; $1 \leq z \leq 8$); lithium alloy; silicon alloy; tin alloy; metal oxides such as SnO, $SnO_2$, PbO, $PbO_2$, $Pb_2O_3$, $Pb_3O_4$, $Sb_2O_3$, $Sb_2O_4$, $Sb_2O_5$, GeO, $GeO_2$, $Bi_2O_3$, $Bi_2O_4$, and $Bi_2O_5$; conductive polymers such as polyacetylene; and Li—Co—Ni-based materials.

The conductive material is usually added in an amount of 1 to 30% by weight based on the total weight of the mixture including the positive electrode active material. Such a conductive material is not particularly limited as long as it has electrical conductivity without causing a chemical change in the battery, and examples thereof include graphite such as natural graphite and artificial graphite; carbon black such as carbon black, acetylene black, Ketjen black, channel black, furnace black, lamp black, and summer black; conductive fibers such as carbon fiber and metal fiber; metal powders such as carbon fluoride, aluminum and nickel powder; conductive whiskey such as zinc oxide and potassium titanate; conductive metal oxides such as titanium oxide; and conductive materials such as polyphenylene derivatives and the like.

The binder is added in an amount of 1 to 30% by weight, on the basis of the total weight of the mixture containing the positive electrode active material, as a component that assists in bonding between the active material and the conductive material and bonding to the current collector. Examples of such binders include polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene terpolymer (EPDM), sulfonated EPDM, styrene butylene rubber, fluorine rubber, various copolymers and the like.

The filler is optionally used as a component for inhibiting expansion of an electrode, and is not particularly limited as long as it is a fibrous material without causing a chemical change in the battery. Examples of the filler include olefin polymers such as polyethylene and polypropylene; fibrous materials such as glass fibers and carbon fibers.

Other components, such as viscosity modifiers, adhesion promoters, and the like may be further included optionally or in combination of two or more. The viscosity modifier is a component that adjusts the viscosity of the electrode mixture so that the mixing process of the electrode mixture and the coating process on the current collector thereof may be easy, and may be added up to 30% by weight based on the total weight of the negative electrode mixture. Examples of such a viscosity modifier include carboxy methyl cellulose, polyvinylidene fluoride, and the like, but are not limited thereto. In some cases, the solvent described above may serve as a viscosity modifier.

The adhesion promoter is an auxiliary component added to improve the adhesion of the active material to the current collector and may be added in less than 10% by weight compared to the binder, and some examples thereof include oxalic acid, adipic acid, formic acid, acrylic acid derivatives, itaconic acid derivatives, and the like.

The separator is interposed between the positive electrode and the negative electrode, and an insulating thin film having high ion permeability and mechanical strength is used. The pore diameter of the separator is generally 0.01 to 10 micrometers, and the thickness is generally 5 to 300 micrometers. Examples of such a separator include olefin-based polymers such as polypropylene which is chemically resistant and hydrophobic; a sheet or a nonwoven fabric made of glass fiber, polyethylene or the like.

The lithium salt-containing non-aqueous electrolyte solution consists of an electrolyte and a lithium salt. And a non-aqueous organic solvent, an organic solid electrolyte, an inorganic solid electrolyte, and the like are used as the electrolyte solution.

Examples of the non-aqueous organic solvent include N-methyl-2-pyrrolidinone, propylene carbonate, ethylene carbonate, butylenecarbonate, dimethyl carbonate, diethyl carbonate, gamma-Butyrolactone, 1,2-dimethoxyethane, tetrahydroxyfuran, 2-methyltetrahydrofuran, dimethylsulfoxide, 1,3-dioxolane, formamide, dimethylformamide, dioxolane, acetonitrile, nitromethane, methyl formate, methyl acetate, phosphoric acid triester, trimethoxymethane, dioxolane derivatives, sulfolane, methyl sulfolane, 1,3-dimethyl-2-imidazolidinone, propylene carbonate derivatives, tetrahydrofuran derivatives, ethers, methyl pyrophosphate, ethyl propionate, etc.

Examples of the organic solid electrolyte include a polymer electrolyte such as a polyethylene derivative, a polyethylene oxide derivative, a polypropylene oxide derivative, a phosphate ester polymer, an agitation lysine, a polyester sulfide, a polyvinyl alcohol, a polyvinylidene fluoride, a polymerizer including an ionic dissociation group, and the like.

Examples of the inorganic solid electrolyte include nitrides, halides, and sulfates of Li such as $Li_3N$, $LiI$, $Li_5NI_2$, $Li_3N$—$LiI$—$LiOH$, $LiSiO_4$, $LiSiO_4$—$LiI$—$LiOH$, $Li_2SiS_3$, $Li_4SiO_4$, $Li_4SiO_4$—$LiI$—$LiOH$, and $Li_3PO_4$—$Li_2S$—$SiS_2$.

The lithium salt is a substance that is soluble in the non-aqueous electrolyte. The examples of the lithium salt include $LiCl$, $LiBr$, $LiI$, $LiClO_4$, $LiBF_4$, $LiBioClio$, $LiPF_6$, $LiCF_3SO_3$, $LiCF_3CO_2$, $LiAsF_6$, $LiSbF_6$, $LiAlCl_4$, $CH_3SO_3Li$, $(CF_3SO_2)_2NLi$, chloroborane lithium, lower aliphatic carboxylic acid lithium, lithium 4-phenylborate, imide and the like.

For the purpose of improving charge/discharge characteristics, flame retardancy, etc., pyridine, triethylphosphite, triethanolamine, cyclic ether, ethylenediamine, n-glyme, hexaphosphoric triamide, nitrobenzene derivative, sulfur, quinone imine dye, N-substituted oxazolidinone, N,N-substituted imidazolidine, ethylene glycol dialkyl ether, ammonium salt, pyrrole, 2-methoxyethanol, aluminum trichloride, etc. may be added to the electrolyte. In some cases, a halogen-containing solvent such as carbon tetrachloride or ethylene trifluoride may be further added to impart nonflammability, or a carbon dioxide gas may be further added to improve the high-temperature storage characteristics, and FEC (Fluoro-EthyleneCarbonate), PRS (Propene sultone), and the like may be further added.

In one preferred example, a lithium salt such as $LiPF_6$, $LiClO_4$, $LiBF_4$, and $LiN(SO_2CF_3)_2$ may be added to a mixed solvent of a cyclic carbonate of EC or PC which is a high-dielectric solvent and a linear carbonate of DEC, DMC or EMC which is low viscosity solvent to thereby prepare a non-aqueous electrolyte containing a lithium salt.

In order to achieve the above object, the electrochemical device according to the present invention includes a structure in which a positive electrode, a separator and a negative electrode are sequentially stacked. Herein, the separator has a structure in which at least one through hole communicating between a positive electrode and a negative electrode is formed. Further, at least one interface between the positive electrode and the separator and between the negative electrode and the separator may include a spacer formed at a position not overlapping with the through hole, and the interface on which the spacer is provided may include a through-hole cover material containing a magnetic material.

The through-hole cover material overlaps the through hole formed in the separator and completely covers the through hole, thereby physically blocking contact between the positive electrode and the negative electrode through the through hole. In addition, one or more spacers may be included in the interface between the positive electrode and the separator or between the negative electrode and the separator in a form that does not overlap with the through hole, and the spacers serve to secure a space so that the through hole cover material can be moved inside the electrochemical device.

The spacer serves to support the interface between the positive electrode or the negative electrode and the separator, and at the same time, serves to secure a space in which the through-hole cover material can easily move within the space. Accordingly, the thickness of the spacer is preferably equal to or greater than the thickness of the through-hole cover material.

In addition, the material of the spacer is preferably made of a porous material in order to minimize the effect on the ion conductivity. That is, a porous mesh or a polymer material can be applied. A separator may be used as a material for the spacer. In such a case, as in another embodiment shown in FIG. 3, it is also possible to manufacture a separator by laminating it in multiple layers to a desired predetermined thickness.

On the other hand, the through-hole cover material is not limited to its shape as long as it can cover the through hole, but it is preferable that it has a plate shape to maximize space efficiency while being able to move inside the spacer.

In addition, the through-hole cover material may include one or more magnetic materials selected from Fe, Ni, and Co. By including the magnetic material in the through-hole cover material, it is possible to move the through-hole cover material according to a magnetic field applied at a position spaced apart from the electrochemical device.

At this time, the magnetic material may have a plate shape likewise when the through-hole cover material has a plate shape, and may be formed in a ring shape to minimize the effect on the ionic conductivity. Magnetic materials should be included in order to move the through-hole cover material by the magnetic field. However, an energy storage device, in which an electrochemical device is embedded, for example, may act as an element that inhibits the movement of ions within a battery cell. Therefore, in order to minimize the area occupied by the magnetic material, the magnetic material may be in the form of a ring formed along each end of the through-hole cover material, more preferably a porous material.

As described above, since the magnetic material may include a conductive metal, it may cause a short circuit by simultaneously contacting the positive electrode or the negative electrode. Accordingly, a part or all of the outer peripheral surface of the magnetic material may be surrounded by an insulating material. In this case, the insulating material may be a porous polymer film, and more specifically, may be the same material as the separator.

When the direction orthogonal to the direction in which the positive electrode, the negative electrode and the separator of the electrochemical device are stacked is referred to as a horizontal direction, the horizontal cross-sectional area of the through-hole cover material is larger than the area of the through hole formed in the separator. That is, the through-hole cover material should be larger than the area of the through hole based on the cross-sectional area in the horizontal direction so that it can completely cover the through hole at the position where it overlaps with the through hole, and there is no restriction on the shape, but the through-hole cover material should have a shape that can completely block the through hole.

In addition, a horizontal cross-sectional area inside the spacer is larger than a horizontal cross-sectional area of the through-hole cover material. Accordingly, the through-hole cover material can be moved inside the spacer.

On the other hand, the through-hole cover material may be moved by a magnetic field applied from the outside of the electrochemical device. Accordingly, it is possible to completely cover the through hole by overlapping with the through hole, and by exposing the through hole, it is also possible to cause a short circuit by direct contact between the positive electrode and the negative electrode. This positional movement can be made reversibly.

That is, the method for evaluating an internal short circuit using an electrochemical device according to the present invention may be performed in the following steps.

First, a step of manufacturing an electrochemical device including a positive electrode, a negative electrode, a separator having a through hole, a spacer disposed on at least one interface between the positive electrode and the separator or between the negative electrode and the separator, and a through-hole cover material covering the through hole, is performed.

Then, a magnetic field is applied to the through-hole cover material at a position spaced apart from the electrochemical device. At this time, the through-hole cover material containing the magnetic material may be moved according to the intensity and direction of the applied magnetic field.

When the through-hole cover material is moved to expose the through-hole, the separator through-hole covered by the through-hole cover material is exposed. Through this, the positive electrode and the negative electrode can be in direct physical contact, and an internal short circuit can be induced.

Through the above process, it is possible to evaluate the safety according to the internal short circuit by observing the change in the energy storage device such as the secondary battery and the capacitor in which the internal short has occurred.

In addition, if the internal structure of the energy storage device is not deformed due to the internal short circuit, it is possible to move the through-hole cover material again to cover the through hole at a position overlapping with the through hole. Therefore, it is possible to repeatedly perform internal short-circuit evaluation only by moving the through-hole cover material without separate disassembly or reassembly.

With reference to the drawings, a short circuit induction member according to the present invention and a method for evaluating the safety of a battery using the same will be described in more detail.

FIG. 1 schematically shows the structure of a battery cell 100 including an electrochemical device according to an embodiment of the present invention.

Referring to FIG. 1, a battery cell 100 including an electrochemical device according to the present invention may include a positive electrode 110, a negative electrode 120, a separator 130, a spacer 140, and a battery case 150. The spacer 140 may be disposed at an interface between the positive electrode 110 or the negative electrode 120 and the separator 130, and an inner space 141 of the spacer 140 may include a through-hole cover material 10. Meanwhile, a through hole 131 is formed in the separator 130, and the through-hole cover material 10 overlaps with the through hole 131 to completely cover the through hole 131.

An embodiment of the through-hole cover material 10 is shown in FIG. 2. According to the embodiment of FIG. 2, the through-hole cover material 10 includes a magnetic material 11 therein, and the magnetic material 11 may have a porous ring shape. In addition, insulating films 12 and 13 may be provided on the upper and lower surfaces of the magnetic material 11 so that a short circuit does not occur due to contact between the magnetic material 11 and the positive electrode and the negative electrode of the electrochemical device.

On the other hand, FIG. 3 shows the structure of a battery cell 200 including an electrochemical device according to another embodiment of the present invention.

Referring to FIG. 3, a battery cell 200 including an electrochemical device according to the present invention may include a positive electrode 210, a negative electrode 220, a separator 230, a spacer 240, and a battery case 250. The spacer 240 may be disposed at an interface between the positive electrode 210 or the negative electrode 220 and the separator 230, and an inner space 241 of the spacer 240 may include a through-hole cover material 10. In the present embodiment, the spacer 240 may be formed by stacking a plurality of separators, and may be manufactured by stacking the separators to a thickness sufficient for the through-hole cover material 10 to be easily movable.

Meanwhile, a through hole 231 is formed in the separator 230, and the through-hole cover material 10 overlaps with the through hole 231 to completely cover the through hole 231.

A method for evaluating safety due to movement of the through-hole cover material by a magnetic field and an internal short circuit according thereto is shown in detail in FIG. 4.

Referring to FIG. 4, as in step (a) of FIG. 4, a magnetic field is applied from an outer surface of an energy storage device such as a battery cell or a capacitor equipped with an electrochemical device of the present invention. At this time, the through-hole cover material completely covers the through hole of the separator, and the positive electrode and the negative electrode are physically blocked by the through-hole cover unit covering the through hole and are not in direct contact.

When the magnetic field is applied to the magnetic material of the through-hole cover material, it may be applied by a permanent magnet 20 such as neodymium, but the method of applying the magnetic field is not limited thereto.

Referring to step (b) of FIG. 4, the through-hole cover material moves according to the magnetic field applied from the outside, so that the through hole of the separator is exposed. Through this through hole, the positive electrode and the negative electrode come into direct contact, causing an internal short circuit.

Meanwhile, in step (c) of FIG. 4, a magnetic field is applied to the through-hole cover material again to move in the direction of the through hole. In step (d), the through-hole cover material may be moved to a position overlapping with the through hole to completely cover the through hole. Therefore, after step (d), it is possible to repeat steps (a) to (d) again, so that if the energy storage device is not damaged, the safety evaluation can be repeatedly performed without disassembling and reassembling.

DESCRIPTION OF REFERENCE NUMERALS

10: through-hole cover material
11: magnetic material
12: insulating film
13: insulating film
100: battery cell
110: positive electrode
120: negative electrode
130: separator
131: through hole
140: spacer
141: inner space of spacer
150: battery case
200: battery cell
210: positive electrode
220: negative electrode
230: separator
231: through hole
240: spacer
241: inner space of spacer
250: battery case

The invention claimed is:

1. An electrochemical device comprising a positive electrode, a separator and a negative electrode, which are sequentially stacked,
wherein the separator has at least one through hole communicating between the positive electrode and the negative electrode,
wherein at least one interface between the positive electrode and the separator or between the negative electrode and the separator includes a spacer placed at a position not overlapping with the through hole, and
wherein the interface on which the spacer is placed includes a through-hole cover material containing a magnetic material.

2. The electrochemical device of claim 1, wherein the through-hole cover material is plate-shaped.

3. The electrochemical device of claim 1, wherein the through-hole cover material includes one or more magnetic materials selected from Fe, Ni, and Co.

4. The electrochemical device of claim 3, wherein the magnetic material is plate-shaped or ring-shaped.

5. The electrochemical device of claim 3, wherein an outer peripheral surface of the magnetic material is surrounded by an insulating material.

6. The electrochemical device of claim 4, wherein the insulating material is a porous polymer film.

7. The electrochemical device of claim 1, wherein a horizontal cross-sectional area of the through-hole cover material is larger than an area of the through hole formed in the separator.

8. The electrochemical device of claim 1, wherein a horizontal cross-sectional area inside the spacer is larger than a horizontal cross-sectional area of the through-hole cover material.

9. The electrochemical device of claim 1, wherein the through-hole cover material is moved by a magnetic field applied from an outside of the electrochemical device.

10. A method for evaluating a safety according to an internal short circuit of a battery, comprising:
manufacturing an electrochemical device including a positive electrode, a negative electrode, a separator having a through hole, a spacer disposed on at least one interface between the positive electrode and the separator or between the negative electrode and the separator, and a through-hole cover material covering the through hole;
applying a magnetic field to the through-hole cover material at a position spaced apart from the electrochemical device; and
exposing the through hole by removing the through-hole cover material from the through hole.

11. The method of claim 10, further comprising: covering the through hole with the through-hole cover material to cover the through hole again.

* * * * *